United States Patent [19]

Collins et al.

[11] Patent Number: 4,960,753

[45] Date of Patent: Oct. 2, 1990

[54] MAGNETRON DEPOSITION OF CERAMIC OXIDE-SUPERCONDUCTOR THIN FILMS

[76] Inventors: George J. Collins, 807 W. Oak St., Fort Collins, Colo. 80521; John R. McNeil, 13423 Desert Hills NE., Albuquerque, N. Mex. 87111; Zeng-gi Yu, North Aggie Village Apt. 7C, C.S.U., Fort Collins, Colo. 80523

[21] Appl. No.: 372,268

[22] Filed: Jun. 26, 1989

Related U.S. Application Data

[62] Division of Ser. No. 79,879, Jul. 29, 1987, Pat. No. 4,842,704.

[51] Int. Cl.$^5$ .................... C23C 14/34; C23C 14/56; H01L 39/24
[52] U.S. Cl. ................................ 505/1; 204/298.06; 204/298.09; 204/298.19; 204/298.21; 204/298.24; 204/298.25; 204/298.26; 204/298.16; 505/731
[58] Field of Search .................. 204/298 TT, 298 CS, 204/298, PM 298 CM, 298 SM, 298 MC, 298 ME, 298 MD; 505/1, 731

[56] References Cited

U.S. PATENT DOCUMENTS 3,361,659 1/1968 Bertelsen ........................ 204/192.2
3,988,232 10/1976 Wasa et al. ...................... 204/192.18
4,863,576 9/1989 Collins et al. ................... 204/192.15

*Primary Examiner*—Aaron Weisstuch
*Attorney, Agent, or Firm*—William E. Hein

[57] ABSTRACT

Apparatus for depositing and tailoring anisotropic properties of ceramic oxide-superconductor films onto the outer surface of fibers, wires, rods, and bars and onto the inner surface of tubes, as well as onto the surface of disc-shaped substrates, employs first and second vacuum chambers, a cylindrical magnetron structure positioned within the first vacuum chamber, a disc-shaped cold cathode positioned within the first vacuum chamber for providing a beam of energetic electrons for injection into a plasma region of the cylindrical magnetron structure, and a ring-shaped cold cathode positioned within the second vacuum chamber for providing a disc-shaped beam of electrons impinging upon the deposited film for annealing it. The magnetron cathodes comprise either single metal elements or mixtures thereof. A planar magnetron and a line-shaped cold cathode that produces an electron beam impinging on the surface of a planar substrate to provide a uniform strip heat zone are employed for depositing superconducting thin films of metal oxide ceramic materials onto the surface of wide area planar substrates.

7 Claims, 12 Drawing Sheets

MAGNETRON DEPOSITION OF CERAMIC OXIDE-SUPERCONDUCTOR THIN FILMS

REFERENCE TO RELATED APPLICATIONS

This is a division of application Ser. No. 079,879, filed July 29, 1987, now U.S. Pat. No. 4,842,704.

This application is related to the subject matter of U.S. patent application Ser. No. 903,688 entitled Apparatus for Hermetic Coating of Optical Fibers filed Sept. 4, 1986, by George J. Collins and John R. McNeil, now issued as U.S. Pat. No. 4,863,576 and of U.S. patent application Ser. No. 928,518 entitled Travelling-Melt Thin Film Recrystallization Apparatus Employing Magnetic Fields filed Nov. 10, 1986, by George J. Collins et al. and of U.S. patent application Ser. No. 838,372 entitled Wide Area Electron Beam Enhanced Sputter Deposition of Magnetic Thin Films filed Mar. 11, 1986, by George J. Collins et al. and of U.S. patent application Ser. No. 636,395 entitled Glow Discharge Electron Beam Method and Apparatus for the Surface Recrystallization of Solid Substances filed July 31, 1984. The subject matter of these applications is incorporated herein by reference.

BACKGROUND OF THE INVENTION

High-transition-temperature ($T_c > 77$ degrees K.) superconducting materials are more readily useable than low-transition-temperature superconducting materials over a wider range of technological applications because of simplified and lower cost cooling requirements. For example, one class of high-transition-temperature superconducting materials is based on oxide ceramic materials with one component comprising a trivalent rare earth element, such as Yttrium (Y), Lanthanum (La), Neodymium (Nd), Europium (Eu), Samarium (Sm), Gadolinium (Gd), Lutetium (Lu), and Scandium (Sc). The basic chemical representation of these ceramic materials is A-Ba-Cu-0 where A is the trivalent rare earth element. Typical stoichiometry would include $ABa_2Cu_3O_{6+x}$ or $ABa_2Cu_3O_{7-x}$ where x is a variable. These materials are extremely brittle in bulk form and are not easily formed into rods, wires, tubes or plates. The superconductive electron transport in crystalline oxide materials is confined to a crystalline plane in those materials; hence, the film microstructure must be properly aligned with the current flow through the film to achieve anisotropic superconductivity. The relative alignment of the group of crystalline grains strongly affects superconductivity in polycrystalline films; for example, it is important whether the crystallites have a random rather than an ordered distribution of orientations.

The processing of oxide ceramic materials using prior art methods was via grind-sintering fabrication, which is a very time-consuming process. It is also difficult to control the microstructure of products such as grain size and grain orientation and to fabricate thin crystalline films of these materials with the desirable crystalline plane orientation using prior art grind-sinter technology.

A thin film deposition method for oxide ceramic materials would be desirable in order to better control desired microstructure and stoichiometry of these materials. Pending application Ser. No. 903,688 cited above describes the basic apparatus and method for using reactive sputter deposition to coat HMF glass fibers with hermetic thin films. This apparatus principally employs a cylindrical magnetron. An anode is used which either extends partially or entirely along the axis of the magnetron in the form of a mesh. In addition, a coaxial extraction grid may be employed with the apparatus to provide additional ion or electron bombardment of the glass fiber during coating. This external particle bombardment provides a means to tailor the deposited thin film properties toward those physical, chemical and electrical characteristics required of hermetic coatings, such as film density and film stress. In the present invention the ternary metals A-Ba-Cu or the ternary metal ceramic oxides, such as A-Ba-Cu-0, where A is a trivalent rare earth element, are used as the materials for the magnetron cathodes, while gaseous oxygen or mixtures of oxygen and flourine are used as a reactive gas in the magnetron discharge. Other gases such as argon, krypton and nitrogen might be used in addition to oxygen. Film morphology, film stress, and microstructure characteristics such as grain size and grain orientation are better controlled by ion and electron bombardment created by the coaxial extraction grid during deposition, especially when used together with an external magnetic field. The chosen radius of the extraction grid varies its cylindrical area and hence varies the total current extracted. Control of these parameters is difficult using conventional techniques to coat cylindrical or rectangular cross section structures. Film deposition rates up to hundreds of Angstroms per second are possible using magnetron sputtering, especially when the magnetron discharge is electron beam assisted, so that high throughput of coated films of a given thickness is possible. In-situ deposition of a thin film interface layer, on either side of the ceramic oxide film, as well as the deposition of hermetic coatings is possible when using more than one magnetron apparatus operating in tandem.

In sputtering film coatings, the method described by Springer has been used, although it has not been suggested for hermetic coatings. See Robert W. Springer and C.D. Hostford, 20 Journal of Vacuum Science Technology 462–465 (1982). In the referenced method, a film of pure metal, such as aluminum, is sputter deposited using only an inert gas in the magnetron apparatus. Then, a thin film of $Al_xO_y$ or $Al_pN_q$ is deposited by momentarily admitting the reactive gas (oxygen or nitrogen, respectively) into the magnetron apparatus. The variable x and y designate the stoichiometry of the aluminum-oxygen compound. Similarly, p and q designate the stoichiometry of the aluminum-nitrogen compound. Idally, $x=2$, $y=3$, and $p=q=1$, but other stoichiometries of the films are also satisfactory. This second film may be substantially thinner than the first. In this manner, the columnar microstructure of the film is disrupted, making the film more dense. Metals other than Aluminum may be used, as long as they can be reacted in a similar manner with a gas which can be easily employed in the magnetron apparatus. Alternatively, the metal film can be made thin and the molecular film can be made thick.

Pending application Ser. No. 928,518 cited above describes the use of a line-shaped electron beam to create a melt zone on a thin film, combined with a focused magnetic field to reduce crystalline defects in the film over a wide area disc. Application Ser. No. 636,395 teaches electron beam induced zone melt recrystallization of an intermediate polycrystaline or amorphous layer sandwiched between a substrate and an encapsulation layer. The simultaneous use of electron beam heating, together with directed external magnetic fields, which has been previously taught for the reduction of defects may also be effective to both increase the size of crystallites and the narrow distribution of orientations of the crystallites in superconducting materials in one preferred direction over another. Moreover, transition may be made from amorphous to polycrystalline or from polycrystalline to crystalline films by annealing or zone melt recrystallization, respectively.

Conventional differential pumping techniques allow a cylindrical substrate at atmosphereic pressure to be introduced into and from a partial vacuum where the magnetron is located.

SUMMARY OF THE INVENTION

The present invention relates to an apparatus and method for reactive sputter deposition of ternary metal ceramic thin film materials, which are known to be high-transition-temperature superconducting materials. A cylindrical magnetron having a coaxial cathode and a coaxial anode is used to provide a glow discharge for both reactive and conventional sputtering. This structural combination provides the capability of depositing thin films of metal ceramic materials onto a variety of substrate geometries such as fibers, wire rods, and the outer surfaces of tubes having cylindrical, elliptical or rectangular cross sections. An alternative apparatus comprises a planar magnetron or a series of tandem planar magnetrons employing the cathode materials taught herein for depositing films on wide area plates. The electrical power to the magnetron is either D.C. or low frequency A.C. in the case of conducting cathodes and high frequency A.C. or R.F. in the case of insulating cathodes. Both magnetron arrangements may also be used with an auxilliary extraction grid. In the case of the cylindrical magnetron, this auxilliary extraction grid would be cylindrical and be located coaxially with the cathode and anode. By making the cylindrical extraction grid of a larger diameter than the cylindrical anode a larger extraction current may be achieved. In the case of the planar magnetron, this auxiliary extraction grid would be planar and be located parallel to the cathode. The auxilliary extraction grid provides additional bombardment of the coated substrate by ions or electrons, depending upon the electrical bias placed on the extraction grid. Biasing the extraction grid sufficiently positive, relative to the anode, provides electron bombardment, while biasing the extraction grid sufficiently negative, relative to the anode, provides ion bombardment. In the case of R.F. excitation, a net D.C. bias may be established through the conventional use of external capacitors. The thin film properties of the ternary metal ceramic oxide materials are more controllable using the deposition method of the present invention since film morphology, film stress, stoichiometry and anisotropic microstructure are all influenced by the bombardment by ions and electrons during film deposition.

An external electron beam, created by a cold cathode operating in the abnormal glow discharge region may also be used with the magnetron apparatus of the present invention to create an electron beam propagating along the longitudinal axis of the magnetron. The function of this dual discharge apparatus is to inject beam electrons into the magnetron plasma region to help initiate and sustain the magnetron discharge. This external electron beam excitation is very desirable in the operation of magnetrons for uniformly coating both the inner and outer surfaces of different shaped substrates at higher deposition rates than conventional magnetrons operating without an auxilliary electron beam or beams. A second external electron beam, generated by a ring-shaped cold cathode, impinging on the outer surface of the substrate may be used as a heat source for annealing the film to increase grain size during or after deposition. Optimum operation of the ring-shaped electron gun may require a higher pressure than that considered optimum for operation of the magnetron. In this case two separate chambers and differential pumping techniques may be employed. An external magnetic field oriented in a particular direction may also be used during the annealing step to preferentially align the crystalline orientation of the different crystalline grains in the superconducting films along the direction of the magnetic field to obtain the desired anisotropic directional properties. Conventional magnetron and electron gun power supplies and conventional cathode cooling are employed. That is, when using conducting cathodes either low frequency A.C. or D.C. power supplies are used, whereas in the case of insulating cathodes either high frequency A.C. or radio frequency power supplies are used.

In one implementation, the ternary mixture of metal oxide ceramic materials is formed as one cathode of the cylindrical magnetron. A discharge in the magnetron of an inert gas and oxygen or possibly fluorine is employed to create cathode sputtering of the metal oxides. Alternatively, tandem cathodes located in one magnetron or in two or more tandem magnetrons may each provide one or more metal elements. Oxygen and a mixture of inert gases are then employed as the reactive gas and sputtering buffer gas, respectively, so that metal oxide ceramic films are deposited. Thirdly, pure metals may be sputter deposited using the arrangements just described, but by employing only inert gases in the magnetron discharges. The deposited pure metal film is subsequently plasma oxidized to form the metal oxide ceramic material.

Finally, the deposited films may be electron beam annealed to increase Grain size and preferentially orient the grains by means of a directed external magnetic field. Alternatively, the amorphous or polycrystalline metal oxide ceramic films may be zone melt recrystalized to form a substanitally single crystal film. This may occur through either seeded or unseeded crystal growth. The interface layer may also be a crystalline film having similar crystal structure to the A-Ba-Cu-0 to act as a seed bed for crystallization of the high $T_c$ superconductor, but having much simpler components, such as $SrTiO_3$. Using this crystal film interface layer as crystalline seed, a crystallized superconducting film of the desired orientation can grow when thermally processed after deposition. The top interface layers also act with top encapsulating layer to encourage the growth of large-grain-size crystalline films and prevent the beading up of molten material.

The use of additional tandem magnetrons with cathodes comprising hermetic or interface materials for in-situ coating allows the addition of hermetic seals and interface layers, respectively, adjacent to both the top and bottom of the superconducting film. Molecular species film material may be first deposited, with the metal film subsequently deposited using the method of Springer previously cited. Thus, it is possible to both protect the ceramic oxide layer from being poisoned by foreign atoms from the surrounding environment and to improve the mechanical characteristics of the interface or hermetic film as well as the sandwiched metal oxide ceramic film. Moreover, these interface and hermetic layers of films can also block diffusion of atoms and molecules from the superconducting film. For example, they can retain oxygen which might otherwise escape during electron beam induced thermal processing, as described herein. All steps in the multi-layer deposition process, as well as additional electron beam induced annealing or zone melt recrystallization steps may be performed in-situ in a tandem magnetron reactor.

DESCRIPTION OF THE ILLUSTRATED EMBODIMENTS OF THE INVENTION

Figure 1:
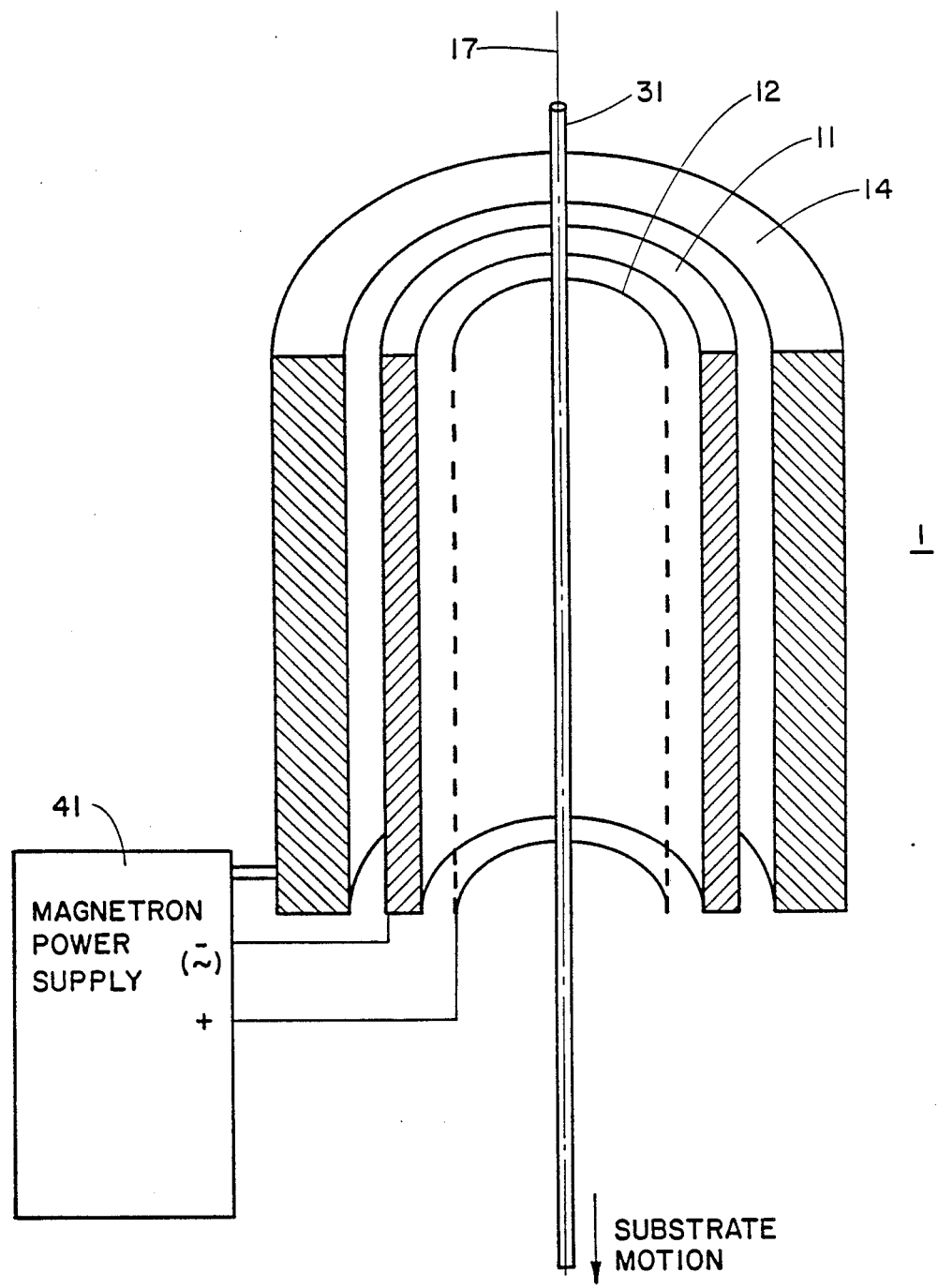
FIG. 1 is an illustration in cross section of a single cylindrical magnetron employing a coaxial cathode, anode, and substrate to be coated.
Figure 2A:
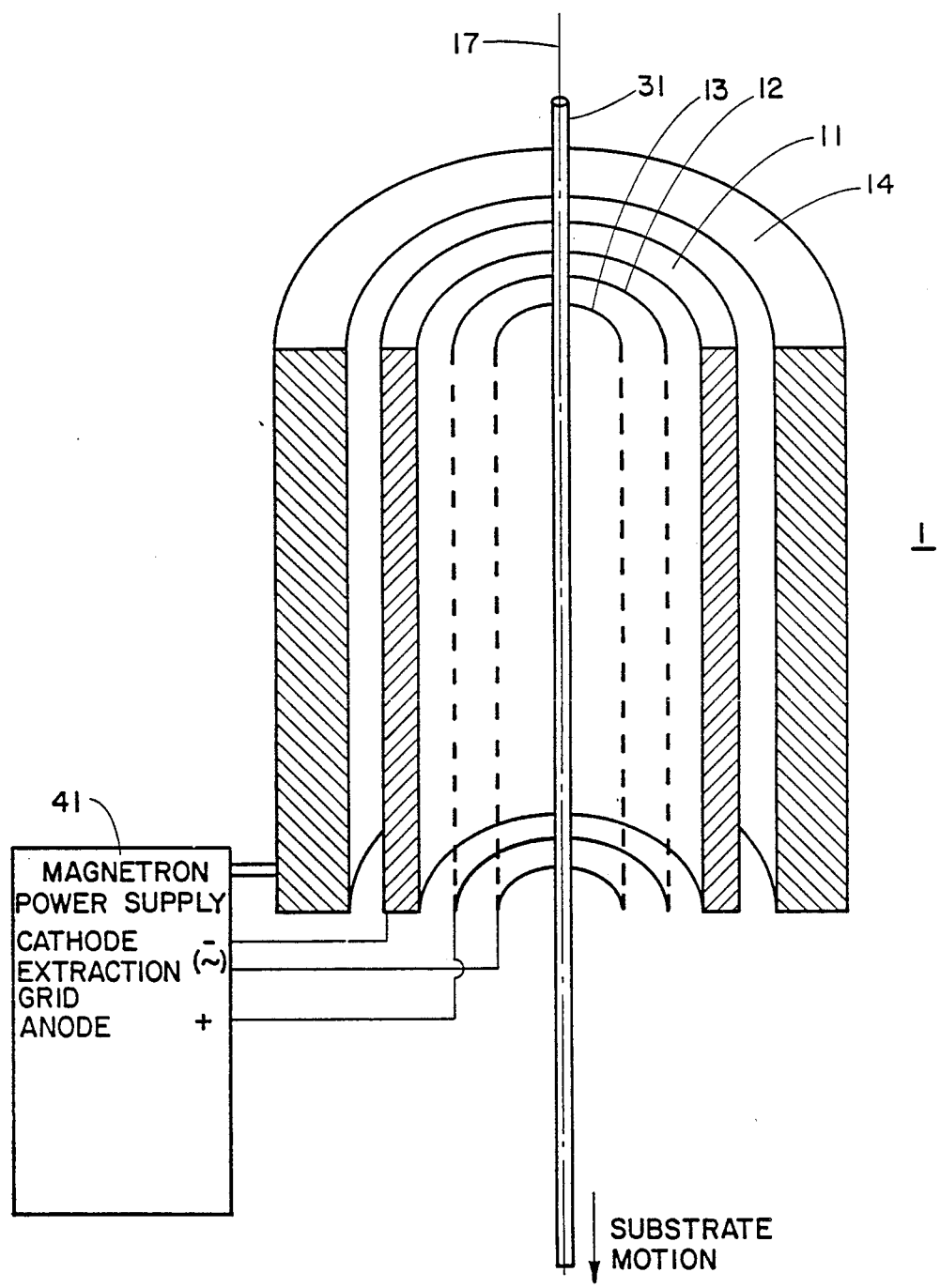
FIG. 2A is an illustration in cross section of a cylindrical magnetron having an extraction grid whose diameter is less than that of the anode.
Figure 2B:
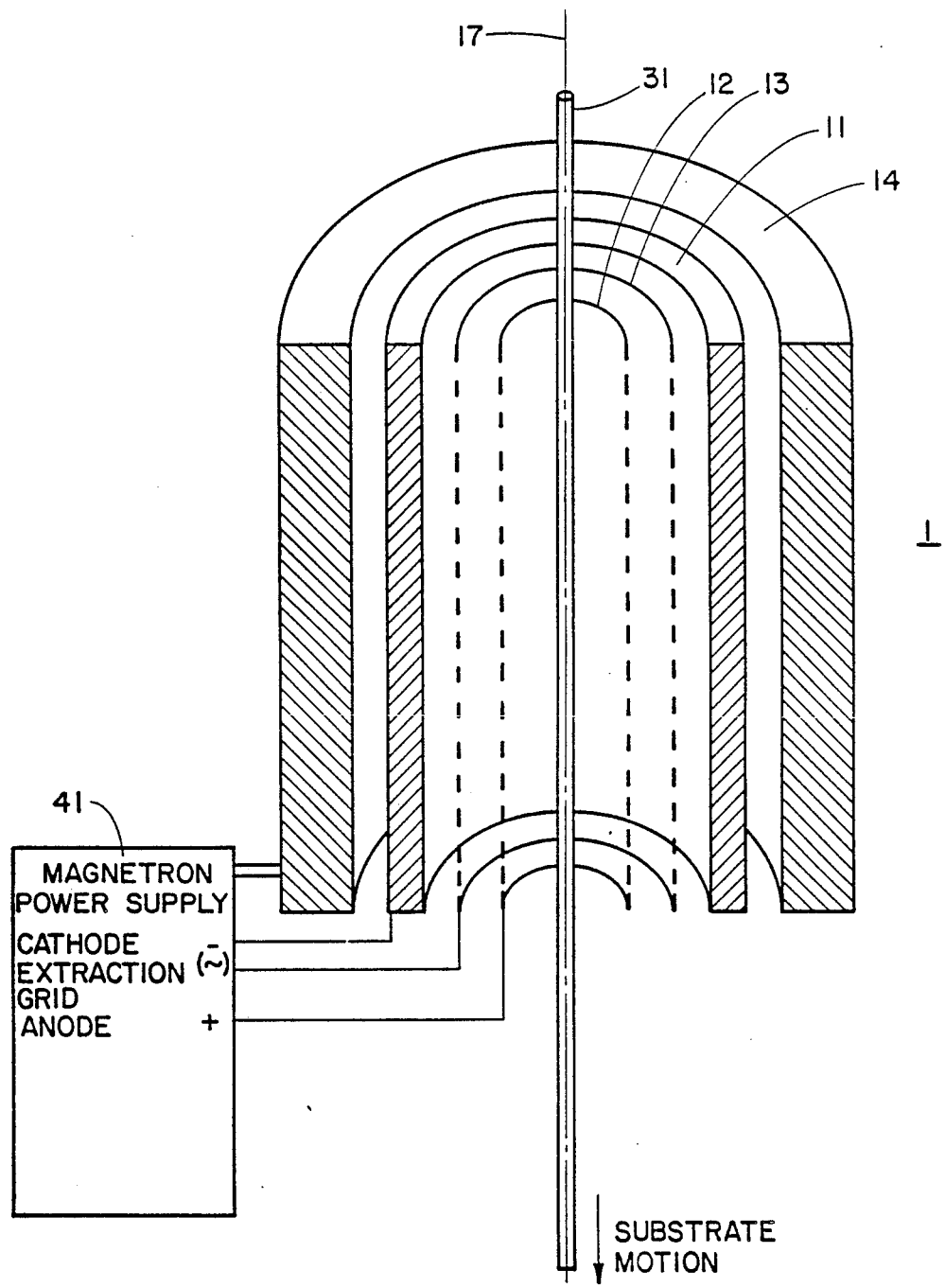
FIG. 2B is an illustration in cross section of a cylindrical magnetron having an extraction grid whose diameter is greater than that of the anode.

Referring now to FIGS. 1-4, a substrate 31 of cylindrical, elliptical, or rectangular cross section to be coated on its outer surface with a ternary metal oxide ceramic material is drawn through a cylindrical magnetron 1. The substrate 31 at atmospheric pressure enters the magnetron vacuum chamber 72 via an intermediate vacuum chamber 71 using conventional differential pumping techniques. The substrate 31 may be rotated about the longitudinal axis to allow for more uniform film deposition and avoid shadow masking from the cylindrical extraction grid 13 or from the cylindrical anode 12. Alternatively, the cylindrical extraction grid 13 and the cylindrical anode 12 may be constructed from a conducting mesh material having helical shaped wire elements extending along the length of the magnetron 1, as opposed to elements essentially parallel to the magnetron about the longitudinal axis 17, thus yielding a uniform coating on the substrate 31 if it is drawn through the magnetron 1. The cross-sectional geometry of magnetron 1 may be made elliptical or rectangular if desired to be consistent with the geometry of the substrate 31. Cylindrical magnetron 1 comprises a cylindrical cathode 11, a cylindrical anode 12 extending partially or entirely along the longitudinal axis of magnetron 1 to act as the anode of magnetron discharge, a cylindrical extraction grid 13 to control the flux and type of charged particles impinging on the substrate 31, and a cylindrical solenoid 14 for creating a longitudinal magnetic field within the cylindrical magnetron 1. If the cylindrical anode 12 extends entirely along the longitudinal axis of magnetron 1, it is constructed of a conducting mesh material. If it only extends partially along the longitudinal axis of the cylindrical magnetron 1, it may be constucted of a solid material. Solenoid 14 may comprise a plurality of solenoids, each in the shape of an annulus, and coacting to form either uniform magnetic fields within the solenoid 14 or non-uniform magnetic fields at the ends of the solenoid 14, as described in detail in pending application Ser. No. 903,688. The cathode 11, anode 12, extraction grid 13, and solenoid 14 are positioned coaxially with respect to each other along a longitudinal axis 17 that is coincident with the longitudinal axis of substrate 31. Cathode 11 is constructed of a ternary mixture of metals or their oxides; that is A-Ba-Cu or A-Ba-Cu-0, respectively. A is the trivalent rare earth element. Alternatively, cathode 11 may comprise a plurality of cylindrical segments, each of which is constructed of a single elemental metal material, such as A, Ba, Cu or of a single metal oxide. When cathode 11 is metallic, D.C. or low frequency A.C. is used to power the cylindrical magnetron 1. When the cathode 11 is insulating, high frequency A.C. or R.F. power is applied to the cylindrical magnetron 1. Typical stoichiometries would be 1 for the trivalent rare earth A, 2 for the metal Ba, 3 for the metal Cu and $(6+x)$ or $(7-x)$ for the oxygen component 0, respectively, where x is a variable. In the multiple tandem magnetron apparatus of FIG. 5, the cathodes 11 are constructed of the trivalent rare earth A and the metals Ba and Cu, respectively. An oxygen-rare gas mixture in the pressure range of 0.5 to 10 mTorr is selected for reactive sputtering when using a ternary metal mixture for the magnetron cathode. Alternatively, a pure rare gas or rare gas/oxygen mixture is used to directly sputter the ternary metal ceramic oxide materials when they are employed as the cathode 11.

A disc-shaped cold cathode 21 having a central aperture provides a longitudinal electron beam 22 which is injected into the cylindrical magnetron plasma along the longitudinal axis 17. It is noteworthy that the cold cathode 21 can operate in a partial mixture of oxygen without poisoning the cold cathode 21. The geometry of the cold cathode 21 determines the cross section of the electron beam that is generated. For example, a donut-shaped cathode is employed to produce an electron beam of donut-shaped cross section. The longitudinal magnetic field produced by solenoid 14 enhances the ionization efficiency of the magnetron discharge by trapping the electron beam 22 and hence increases the flux of ion bombardment onto cathode 11.

The cathode materials are sputtered by the bombarding ions and subsequently coated onto the substrate 31. Reactive oxidation of the deposited films occurs when the magnetron discharge contains oxygen. The properties of thin films deposited onto the substrate 31 are controlled by the magnetron discharge parameters, by the cold cathode electron gun, and by the electrical bias placed upon the extraction grid 13.

Figure 3:
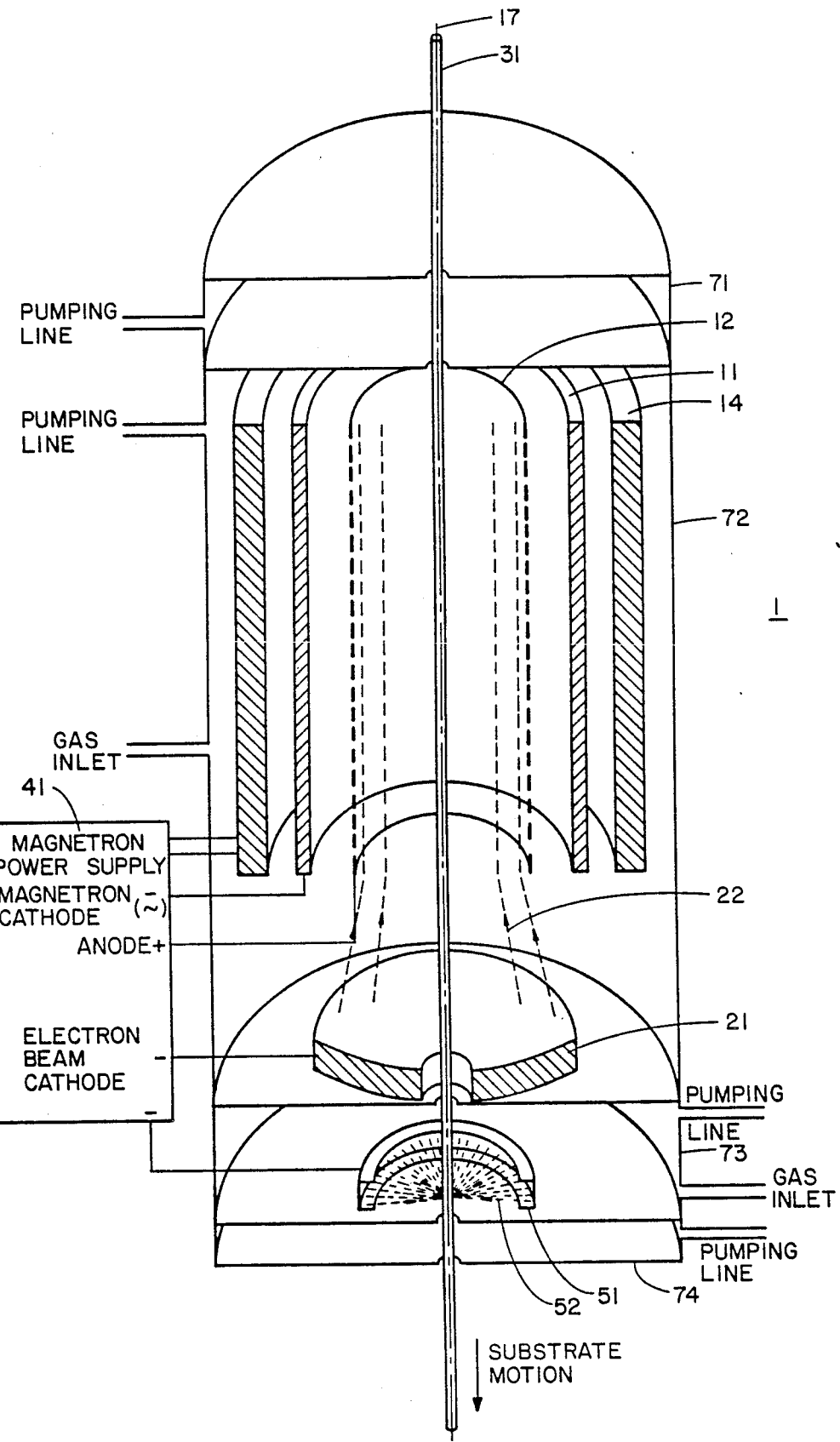
FIG. 3 is an illustration in cross section of a cylindrical magnetron and two external electron beam sources.
Figure 4A:
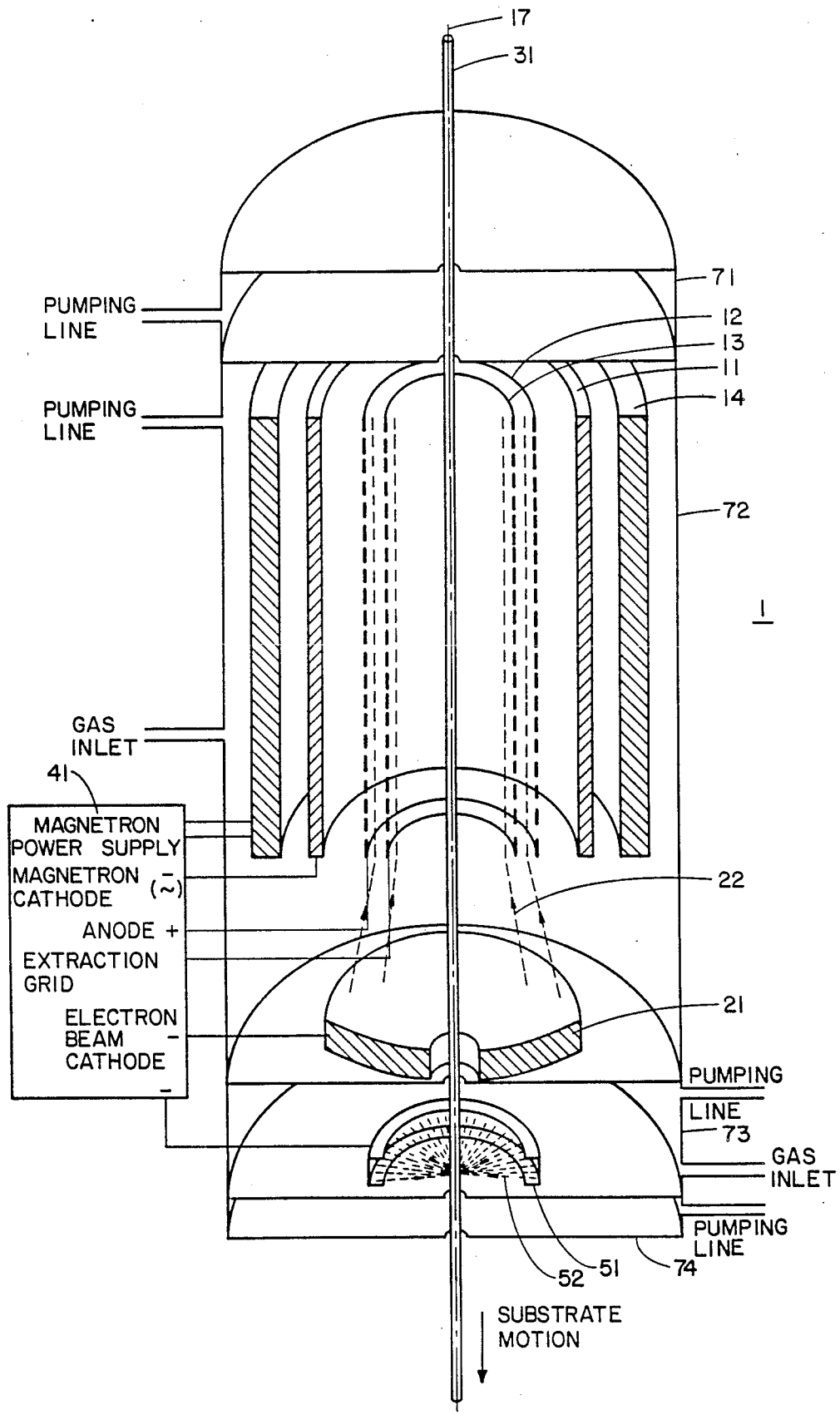
FIG. 4A is an illustration in cross section of a cylindrical magnetron and two external electron beam sources, the cylindrical magnetron having a cylindrical extraction grid whose diamter is less than that of the anode.
Figure 4B:
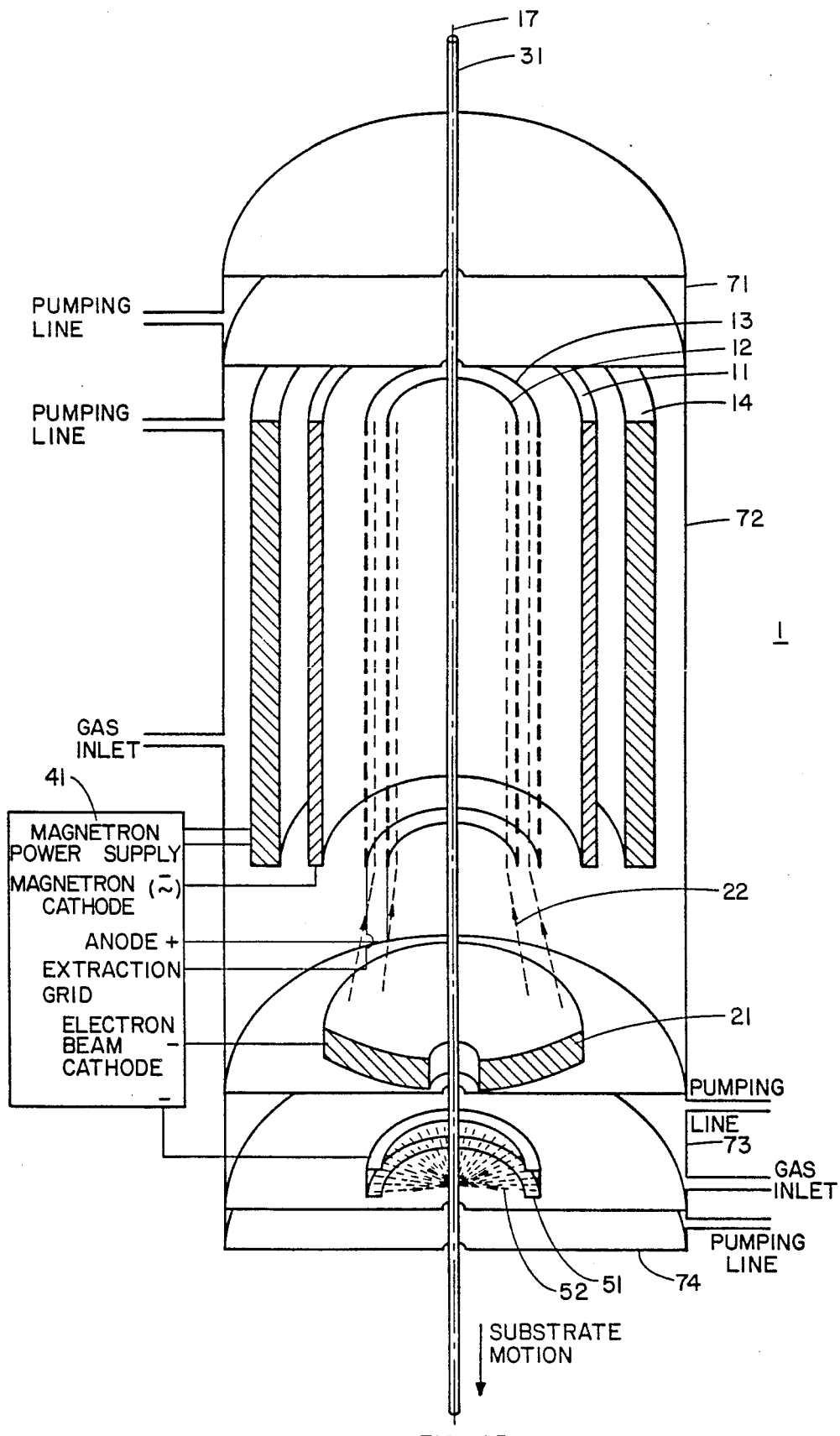
FIG. 4B is an illustration in cross section of a cylindrical magnetron and two external electron beam sources, the cylindrical magnetron having a cylindrical extraction grid whose diameter is greater than that of the anode.
Figure 5:
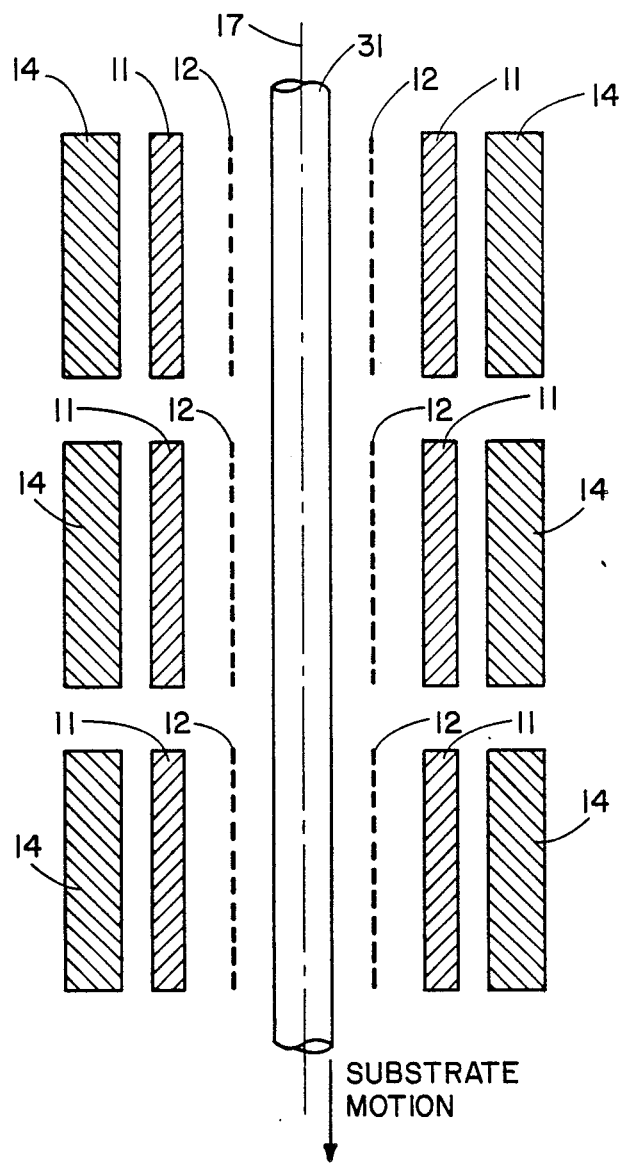
FIG. 5 is an illustration in cross section of multiple magnetrons positioned in tandem.

A ring-shaped cold cathode 51, which can operate in a partial mixture of oxygen, provides a circular or disc-shaped electron beam 52 that impinges on the outer diameter of the substrate 31. The electron beam 52 heats the pure metal or metal oxide ceramic material films deposited on substrate 31 either to oxidize them, to anneal them or to zone melt recrystallize them, depending on the relative power level of electron beam 52 and the speed of substrate motion. The ring-shaped cold cathode 51 or the disc-shaped cold cathode 21 may have an optimum operating pressure that is different from that required for the cylindrical magnetron 1. Hence, separate vacuum chambers could be used for each. Alternatively, the cylindrical magnetron and the disc-shaped cold cathode 21 may be placed together in one chamber. In FIGS. 3 and 4A-B, the cylindrical magnetron 1 and the disc-shaped cold cathode 21 are shown in one vacuum chamber 72 while ring-shaped cold cathode 51 is shown in a separate vacuum chamber 73. The different pressures in the chambers 72 and 73 are maintained by conventional differential pumping techniques, the structure of which is not illustrated. Alternatively, the ring-shaped cold cathode 51, the disc-shaped cold cathode 21, and the cylindrical magnetron 1 could be positioned in three separate vacuum chambers, if desired. Finally, the substrate 31 exits from the vacuum chamber 73 via an additional chamber 74, while it enters into vacuum chamber 72 via vacuum chamber 71, which is also differentially pumped, into an atmospheric pressure environment.

A conventional power supply 41 powers the magnetron discharge, the two electron beam abnormal glow discharges, and the extraction grid 13 shown in FIGS. 3 and 4. As mentioned previously, either low frequency A.C. or D.C. is used to power a metallic cathode 11, while high frequency A.C. or R.F. is used to power an insulating cathode 11. Extraction grid 13 can enhance either electron or ion bombardment of the deposited films on the substrate 31, depending upon the polarity of the electrical potentials applied with respect to the anode 12. For example, if the extraction grid 13 is biased sufficiently positive relative to the anode 12, electrons bombard the coating. The radius of the extraction grid and the bias magnitude set the level of the extraction current.

Figure 6:
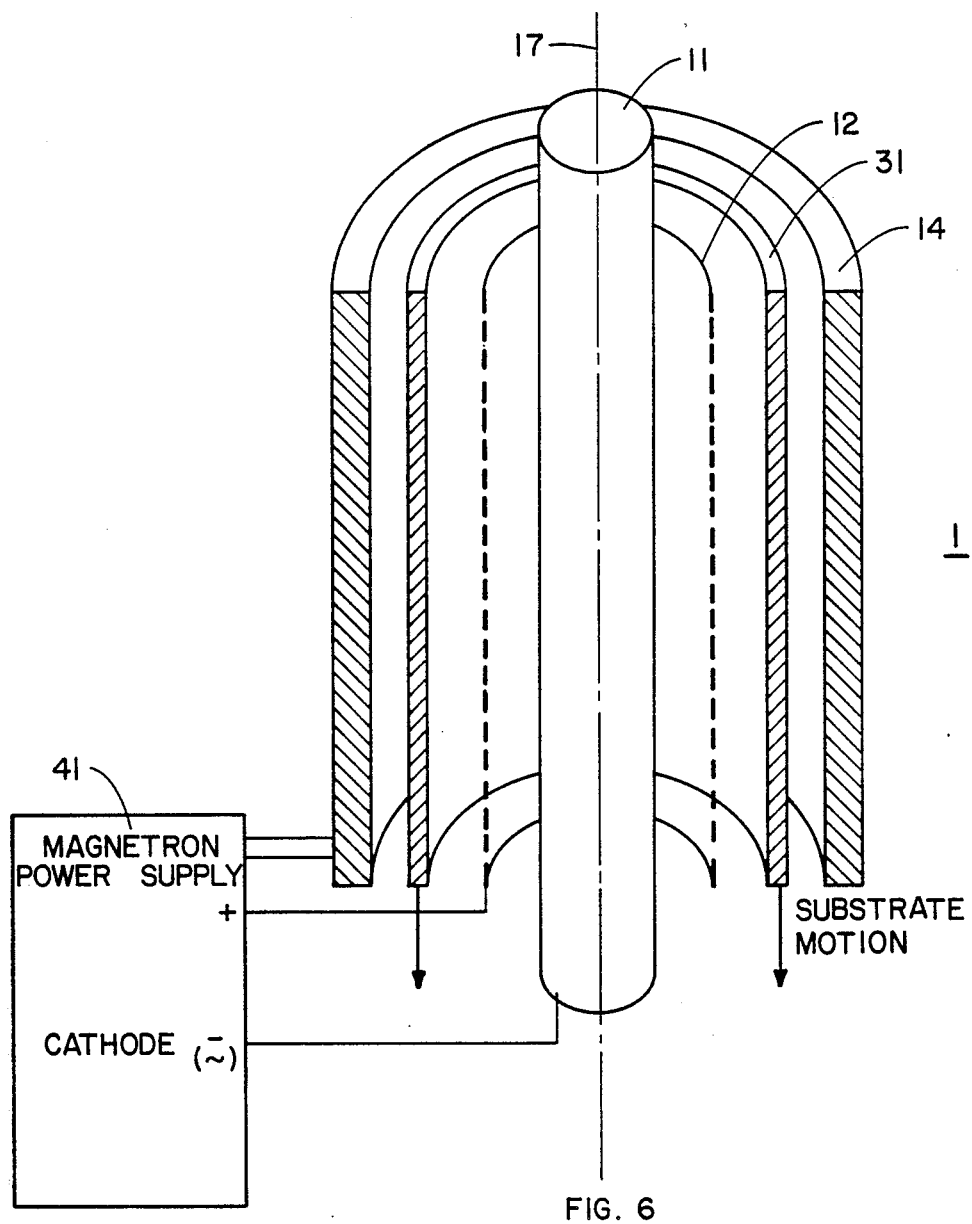
FIG. 6 is an illustration in cross section of a cylindrical post magnetron including a coaxial mesh anode that may be employed for coating the inner surface of a tubular material.
Figure 7A:
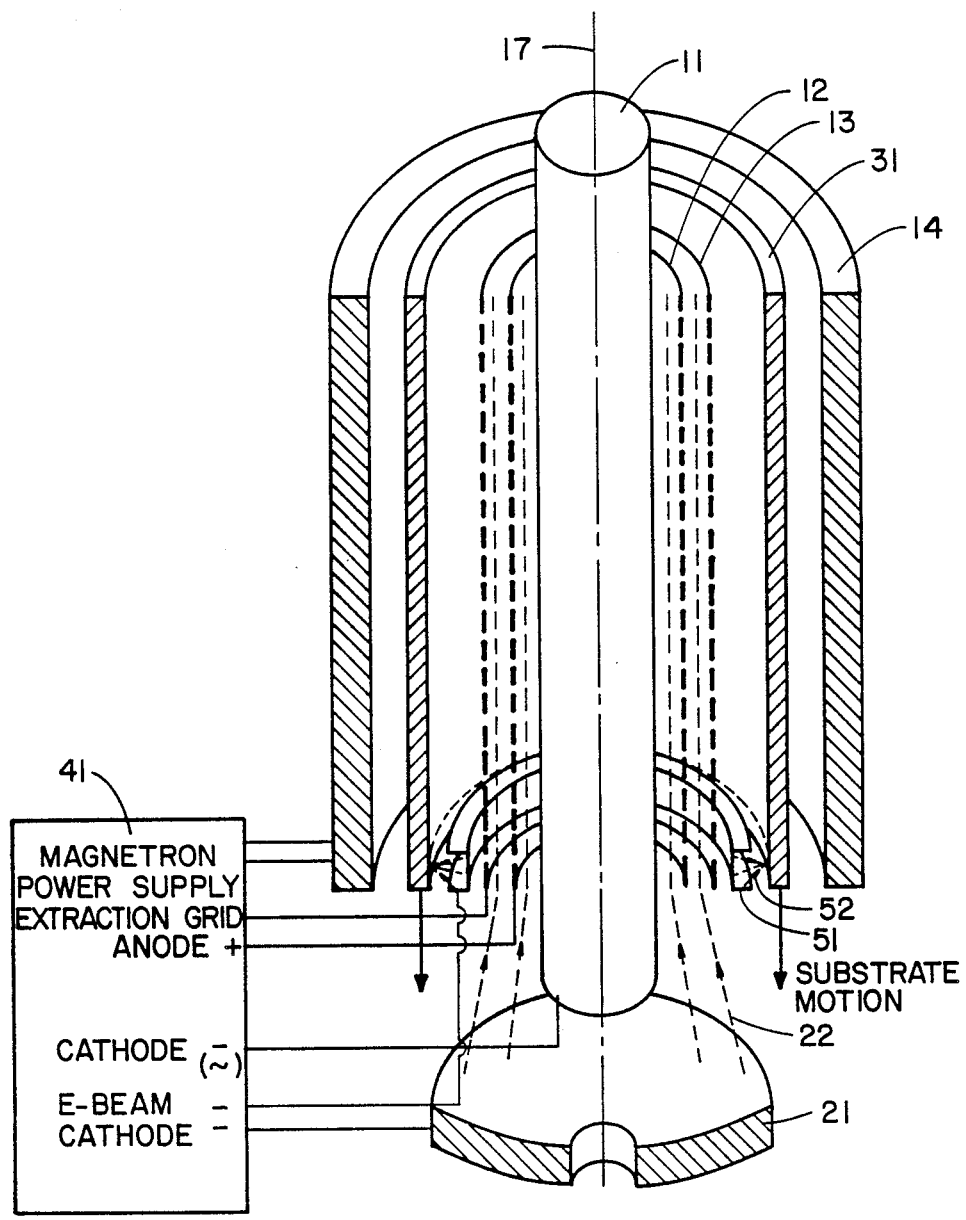
FIG. 7A is an illustration in cross section of a cylindrical post magnetron and two external electron beam sources, the cylindrical magnetron having an extraction grid whose diameter is greater than that of the anode.
Figure 7B:
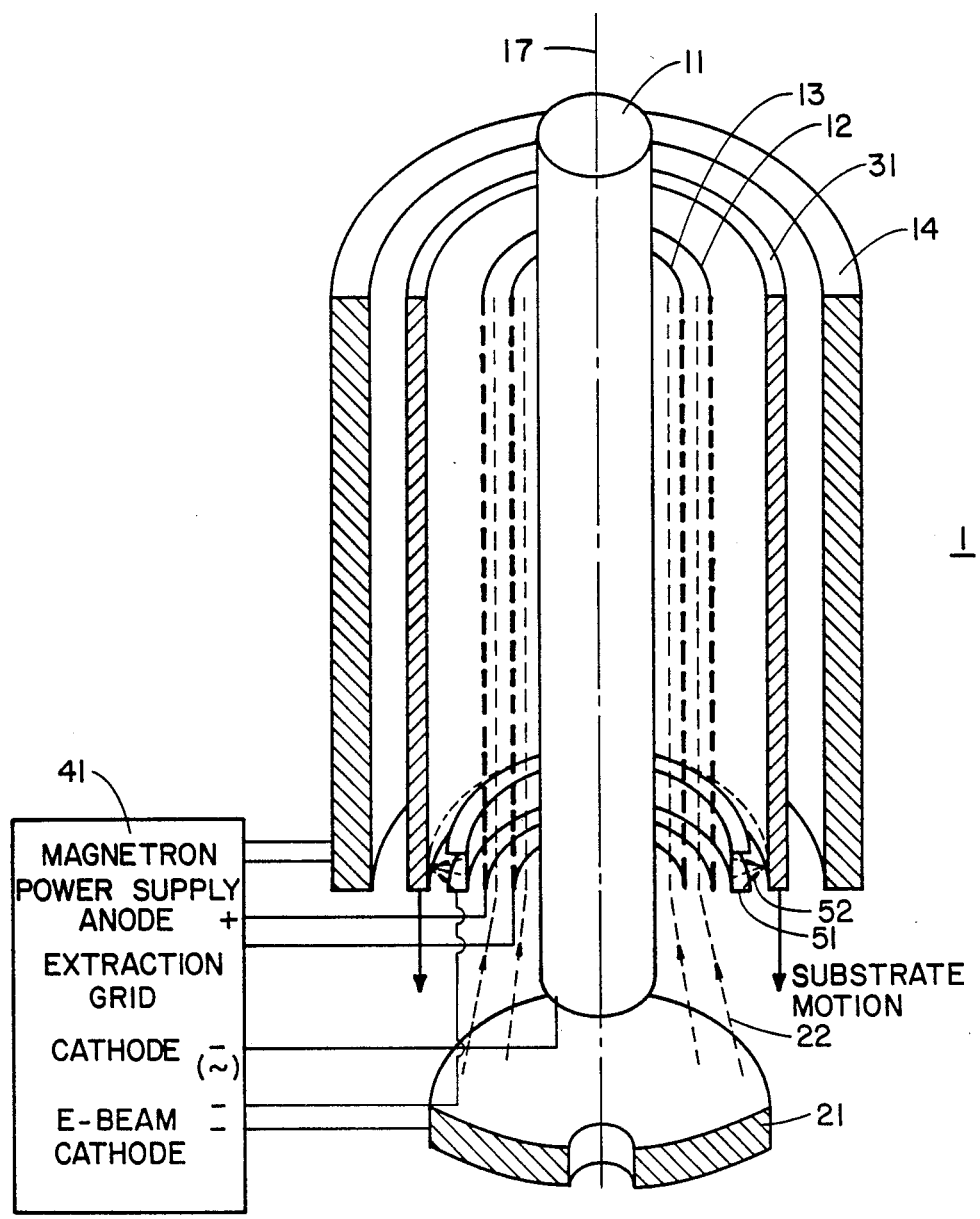
FIG. 7B is an illustration in cross section of a cylindrical post magnetron and two external electron beam sources, the cylindrical magnetron having an extraction grid whose diameter is less than that of the anode.
Figure 8:
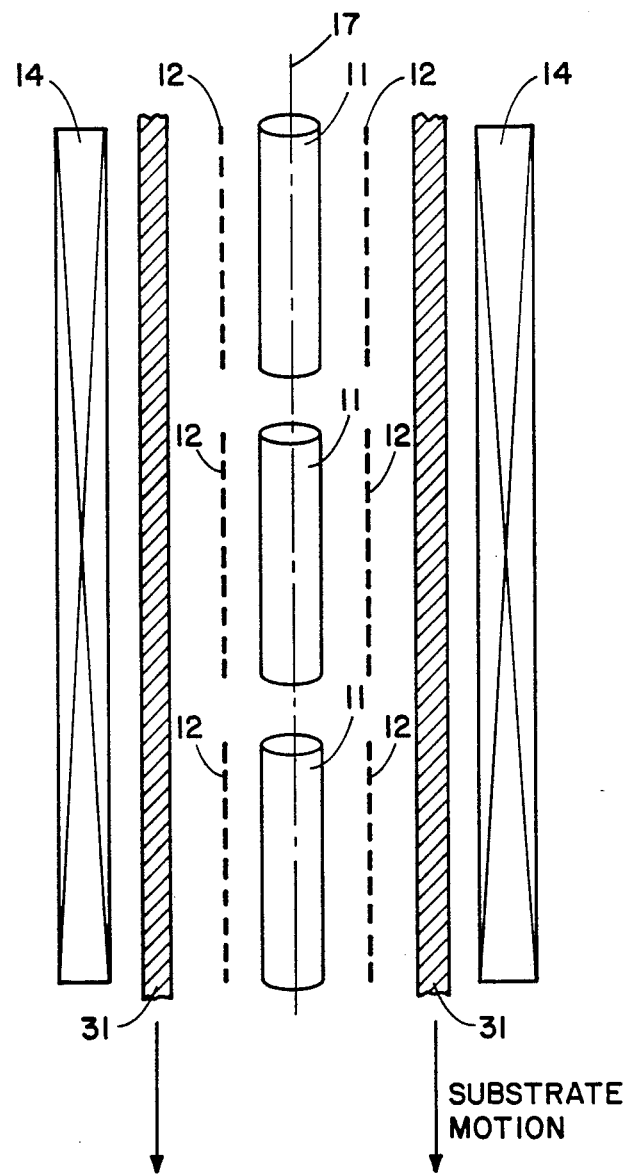
FIG. 8 is an illustration in cross section of multiple cylindrical post magnetrons positioned in tandem.

Referring now to FIG. 6, a substrate 31 of cylindrical, elliptical or rectangular cross section whose inner surface is to coated with the ternary metal oxide ceramic material is located coaxially with respect to the post cathode 11 and the magnetron solenoid 14. The post cathode 11 may be of cylindrical, elliptical or rectangular cross section, corresponding to the shape of substrate 31. The magnetron discharge is powered by power supply 41 to provide ions that sputter materials from the cathode 11 onto the inner surface of substrate 31. Reactive oxidation of the deposited films occurs when the magnetron discharge contains oxygen. An anode 12 may be positioned coaxially with respect to the cathode 11 and may extend either partially or entirely along the longitudinal axis 17 of magnetron 1. A conducting mesh anode is employed when using insulating materials for the substrate 31 or when the coating placed on the substrate 31 is one that exhibits high resistivity at the temperature used during deposition, such as metal oxide ceramic materials. Under those conditions, the substrate 31 could not act as an anode for D.C. or low frequency A.C. voltages. An extraction grid 13, a disc-shaped cold cathode electron source 21, and a ring-shaped cold cathode electron source 51, may be employed as illustrated in FIGS. 7A and 7B. These elements function the same as stated above in connection with the description of FIGS. 3 and 4.

Figure 9:
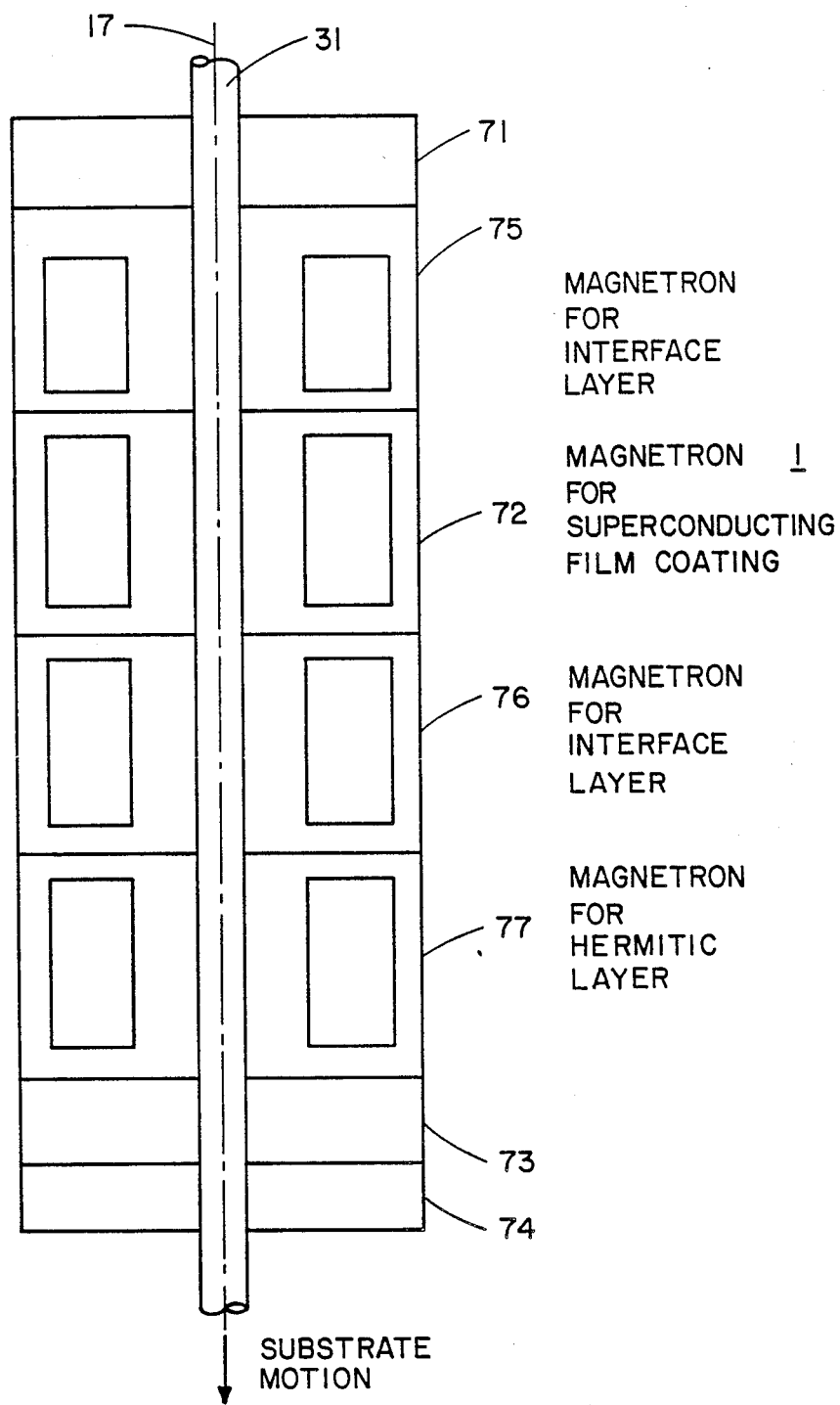
FIG. 9 is an illustration in cross section of multiple magnetrons positioned in tandem for in-situ multilayer film deposition.

Following deposition, the deposited films are thermally annealed by employing, for example, the electron beam 22 produced by the cold cathode electron source 21 or by a second external electron beam 52 that may be produced by a ring-shaped cold cathode electron source 51. In the electron beam annealing step, the use of a partial pressure of oxygen is very helpful in preventing undesired oxygen loss from the superconducting film. Either a unidirectional external magnetic field directed radially or the unidirectional longitudinal magnetic field produced by the solenoid 14 is employed to achieve the desired alignment of crystallites in the superconducting film with respect to the desired direction of anisotropic superconducting properties. Alternatively, a line-shaped electron beam may be employed in combination with the focused line-shaped magnetic fields to achieve crystalline re-orientation of films deposited on wide area plates. In-situ hermetic seals and interface coatings may be deposited when the substrate is drawn into subsequent sections of the tandem magnetrons which include specific cathode materials for the specific layers of coatings desired, as shown in FIG. 9. In FIG. 9, the substrate 31 passes from and to atmospheric pressure via vacuum chambers 71 and 74, respectively. Note that the cylindrical magnetron 1 for depositing metal oxide ceramic material is located in vacuum chamber 72, the interface layer magnetrons are located in vacuum chambers 75 and 76, and the hermetic layer magnetron is located in vacuum chamber 77. The top interface and hermetic layers on the superconducting film block the diffusion of atoms from the film during subsequent thermal processing. For example, they prevent oxygen from escaping during electron beam induced thermal processing. These layers may also act as an encapsulant for zone melt recrystallization of the metal oxide ceramic material. That is, these layers prevent the physical beading up of molten metal oxide ceramic material and enhance the growth of single crystal films of one preferred orientation upon solidification. The underlying interface layer, if crystalline, may act as a crystal seed bed for the solidifying melt of metal oxide ceramic material in zone melt recrystallization processing.

We claim:
1. Apparatus for depositing a superconducting thin film of metal oxide ceramic materials onto the outer surface of a substrate, the apparatus comprising;
   first and second vacuum chamber means;
   means for positioning a substrate within said first and second vacuum chamber means;
   a cylindrical magnetron positioned within said first vacuum chamber means, the cylindrical magnetron having a longitudinal axis that is substantially coincident with a longitudinal axis of the substrate, having a cylindrical anode coaxially positioned with respect to the substrate, having a cylindrical cathode of diameter greater than that of the cylindrical anode and coaxially positioned with respect to the substrate and the cylindrical anode, and having a cylindrical solenoid of diameter greater than that of the cylindrical cathode and coaxially positioned with respect to the substrate, the cylindrical cathode, and the cylindrical anode;

a disc-shaped cold cathode positioned within the first vacuum chamber means and having an axis that is substantially coincident with the longitudinal axis of the substrate, the disc-shaped cold cathode being positioned proximate to one end of the cylindrical magnetron and being operative for providing a beam of energetic electrons for injection into a plasma region of the cylindrical magnetron;

a ring-shaped cold cathode positioned within the second vacuum chamber means and having an axis that is substantially coincident with the longitudinal axis of the substrate, the ring-shaped cold cathode being positioned proximate to one end of the cylindrical magnetron and being operative for providing a disc-shaped beam of electrons impinging upon the outer surface of the substrate for thermally annealing the superconducting thin film deposited thereon;

power supply means for applying selected operating voltages to the cylindrical cathode, cylindrical anode, cylindrical solenoid, disc-shaped cold cathode, and ring-shaped cold cathode;

vacuum control means, including differential pumping means, coupled to the first and second vacuum chamber means for establishing and maintaining desired vacuum levels within the first and second vacuum chamber means; and gas port means coupled to the vacuum control means and first and second vacuum chamber means for selectively admitting and controlling the flow of one or more selected reactive feedstock gases into the first and second vacuum chamber means.

2. Apparatus for depositing a superconducting thin film of metal oxide ceramic materials onto the outer surface of a substrate, the apparatus comprising:

first and second vacuum chamber means;

means for positioning a substrate within said first and second vacuum chamber means;

a cylindrical magnetron positioned within said first vacuum chamber means, the cylindrical magnetron having a longitudinal axis that is substantially coincident with a longitudinal axis of the substrate, having a cylindrical extraction grid coaxially positioned with respect to the substrate, having a cylindrical anode of diameter greater than that of the cylindrical extraction grid and coaxially positioned with respect to the substrate, having a cylindrical cathode of diameter greater than that of the cylindrical extraction grid and coaxially positioned with respect to the substrate and the cylindrical anode, and having a cylindrical solenoid of diameter greater than that of the cylindrical cathode and coaxially positioned with respect to the substrate, the cylindrical extraction grid, the cylindrical cathode, and the cylindrical anode;

a disc-shaped cold cathode positioned within the first vacuum chamber means and having an axis that is substantially coincident with the longitudinal axis of the substrate, the disc-shaped cold cathode being positioned proximate to one end of the cylindrical magnetron and being operative for providing a beam of energetic electrons for injection into a plasma region of the cylindrical magnetron;

a ring-shaped cold cathode positioned within the second vacuum chamber means and having an axis that is substantially coincident with the longitudinal axis of the substrate, the ring-shaped cold cathode being positioned proximate to one end of the cylindrical magnetron and being operative for providing a disc-shaped beam of electrons impinging upon the outer surface of the substrate for thermally annealing the superconducting thin film deposited thereon;

power supply means for applying selected operating voltages to the cylindrical cathode, cylindrical anode, cylindrical solenoid, disc-shaped cold cathode, and ring-shaped cold cathode;

vacuum control means, including differential pumping means, coupled to the first and second vacuum chamber means for establishing and maintaining desired vacuum levels within the first and second vacuum chamber means; and gas port means coupled to the vacuum control means and first and second vacuum chamber means for admitting and controlling the flow of one or more selected reactive feedstock gases into the first and second vacuum chamber means.

3. Apparatus for depositing a superconducting thin film of metal oxide ceramic materials onto the outer surface of a substrate, the apparatus comprising:

first and second vacuum chamber means;

means for positioning a substrate within said first and second vacuum chamber means;

a cylindrical magnetron positioned within said first vacuum chamber means, the cylindrical magnetron having a longitudinal axis that is substantially coincident with a longitudinal axis of the substrate, having a cylindrical extraction grid coaxially positioned with respect to the substrate, having a cylindrical anode of diameter smaller than that of the cylindrical extraction grid and coaxially positioned with respect to the substrate, having a cylindrical cathode of diameter greater than that of the cylindrical extraction grid and coaxially positioned with respect to the substrate and the cylindrical anode, and having a cylindrical solenoid of diameter greater than that of the cylindrical cathode and coaxially positioned with respect to the substrate, the cylindrical extraction grid, the cylindrical cathode, and the cylindrical anode;

a disc-shaped cold cathode positioned within the first vacuum chamber means and having an axis that is substantially coincident with the longitudinal axis of the substrate, the disc-shaped cold cathode being positioned proximate to one end of the cylindrical magnetron and being operative for providing a beam of energetic electrons for injection into a plasma region of the cylindrical magnetron;

a ring-shaped cold cathode positioned within the second vacuum chamber means and having an axis that is substantially coincident with the longitudinal axis of the substrate, the ring-shaped cold cathode being positioned proximate to one end of the cylindrical magnetron and being operative for providing a disc-shaped beam of electrons impinging upon the outer surface of the substrate for thermally annealing the superconducting thin film deposited thereon;

power supply means for applying selected operating voltages to the cylindrical cathode, cylindrical anode, cylindrical solenoid, disc-shaped cold cathode, and ring-shaped cold cathode;

vacuum control means, including differential pumping means, coupled to the first and second vacuum chamber means for establishing and maintaining desired vacuum levels within the first and second vacuum chamber means; and gas port means coupled to the vacuum control means and first and second vacuum chamber means for admitting and controlling the flow of one or more selected reactive feedstock gases into the first and second vacuum chamber means.

4. Apparatus for depositing a superconducting thin film of metal oxide ceramic materials onto the inner surface of a cylindrical substrate, the apparatus comprising:

first and second vacuum chamber means;

means for positioning a cylindrical substrate within said first and second vacuum chamber means;

a cylindrical magnetron positioned within said first vacuum chamber means, the cylindrical magnetron having a longitudinal axis that is substantially coincident with a longitudinal axis of the cylindrical substrate, having a cylindrical anode of diameter smaller than that of the cylindrical substrate and coaxially positioned with respect to the cylindrical substrate, having a post cathode of diameter smaller than that of the cylindrical anode and coaxially positioned with respect to the cylindrical substrate and the cylindrical anode, and having a cylindrical solenoid of diameter greater than that of the cylindrical substrate and coaxially positioned with respect to the cylindrical substrate, the post cathode, and the cylindrical anode;

a disc-shaped cold cathode positioned within the first vacuum chamber means and having an axis that is substantially coincident with the longitudinal axis of the cylindrical substrate, the disc-shaped cold cathode being positioned proximate to one end of the cylindrical magnetron and being operative for providing a beam of energetic electrons for injection into a plasma region of the cylindrical magnetron;

a ring-shaped cold cathode positioned within the second vacuum chamber means and having an axis that is substantially coincident with the longitudinal axis of the cylindrical substrate, the ring-shaped cold cathode having a diameter smaller than that of the cylindrical substrate, being positioned proximate to one end of the cylindrical magnetron, and being operative for providing a disc-shaped beam of electrons impinging upon the inner surface of the cylindrical substrate for thermally annealing the superconducting thin film deposited thereon;

power supply means for applying selected operating voltages to the post cathode, cylindrical anode, cylindrical solenoid, disc-shaped cold cathode, and ring-shaped cold cathode;

vacuum control means, including differential pumping means, coupled to the first and second vacuum chamber means for establishing and maintaining desired vacuum levels within the first and second vacuum chamber means; and gas port means coupled to the vacuum control means and first and second vacuum chamber means for admitting and controlling the flow of one or more selected reactive feedstock gases into the first and second vacuum chamber means.

5. Apparatus for depositing a superconducting thin film of metal oxide ceramic materials onto the inner surface of a cylindrical substrate, the apparatus comprising:

first and second vacuum chamber means;

means for positioning a cylindrical substrate within said first and second vacuum chamber means;

a cylindrical magnetron positioned within said first vacuum chamber means, the cylindrical magnetron having a longitudinal axis that is substantially coincident with a longitudinal axis of the cylindrical substrate, having a cylindrical extraction grid of diameter smaller than that of the cylindrical substrate and coaxially positioned with respect to the cylindrical substrate, having a cylindrical anode of diameter smaller than that of the cylindrical substrate but grater than that of the cylindrical extraction grid and coaxially positioned with respect to the cylindrical substrate, having a post cathode of diameter smaller than that of the cylindrical extraction grid and coaxially positioned with respect to the cylindrical substrate and the cylindrical anode, and having a cylindrical solenoid of diameter greater than that of the cylindrical substrate and coaxially positioned with respect to the cylindrical substrate, the cylindrical extraction grid, the post cathode, and the cylindrical anode;

a disc-shaped cold cathode positioned within the first vacuum chamber means and having an axis that is substantially coincident with the longitudinal axis of the cylindrical substrate, the disc-shaped cold cathode being positioned proximate to one end of the cylindrical magnetron and being operative for providing a beam of energetic electrons for injection into a plasma region of the cylindrical magnetron;

a ring-shaped cold cathode positioned within the second vacuum chamber means and having an axis that is substantially coincident with the longitudinal axis of the cylindrical substrate, the ring-shaped cold cathode having a diameter smaller than that of the cylindrical substrate, being positioned proximate to one end of the cylindrical magnetron, and being operative for providing a disc-shaped beam of electrons impinging upon the inner surface of the cylindrical substrate for thermally annealing the superconducting thin film deposited thereon;

power supply means for applying selected operating voltages to the post cathode, cylindrical anode, cylindrical solenoid, disc-shaped cold cathode, and ring-shaped cold cathode;

vacuum control means, including differential pumping means, coupled to the first and second vacuum chamber means for establishing and maintaining a desired vacuum with the first and second vacuum chamber means; and gas port means coupled to the vacuum control means and first and second vacuum chamber means for admitting and controlling the flow of one or more selected reactive feedstock gases into the first and second vacuum chamber means.

6. Apparatus for depositing a superconducting thin film of metal oxide ceramic materials onto the inner surface of a cylindrical substrate, the apparatus comprising:

first and second vacuum chamber means;

means for positioning a substrate within said first and second vacuum chamber means;

a cylindrical magnetron positioned within said first vacuum chamber means, the cylindrical magnetron having a longitudinal axis that is substantially coincident with a longitudinal axis of the cylindrical substrate, having a cylindrical extraction grid of diameter smaller than that of the cylindrical substrate and coaxially positioned with respect to the cylindrical substrate, having a cylindrical anode of diameter smaller than that of the cylindrical extraction grid and coaxially positioned with respect to the cylindrical substrate, having a post cathode of diameter smaller than that of the cylindrical anode and coaxially positioned with respect to the cylindrical substrate and the cylindrical extraction grid, and having a cylindrical solenoid of diameter greater than that of the cylindrical substrate and coaxially positioned with respect to the cylindrical substrate, the cylindrical extraction grid, the post cathode, and the cylindrical anode;

a disc-shaped cold cathode positioned within the first vacuum chamber means and having an axis that is substantially coincident with the longitudinal axis of the cylindrical substrate, the disc-shaped cold cathode being positioned proximate to one end of the cylindrical magnetron and being operative for providing a beam of energetic electrons for injection into a plasma region of the cylindrical magnetron;

a ring-shaped cold cathode positioned within the second vacuum chamber means and having an axis that is substantially coincident with the longitudinal axis of the cylindrical substrate, the ring-shaped cold cathode being positioned proximate to one end of the cylindrical magnetron and being operative for providing a disc-shaped beam of electrons impinging upon the inner surface of the substrate for thermally annealing the superconducting thin film deposited thereon;

power supply means for applying selected operating voltages to the post cathode, cylindrical anode, cylindrical solenoid, disc-shaped cold cathode, and ring-shaped cold cathode;

vacuum control means, including differential pumping means, coupled to the first and second vacuum chamber means for establishing and maintaining a desired vacuum within the first and second vacuum chamber means; and gas port means coupled to the vacuum control means and first and second vacuum chamber means for admitting and controlling the flow of one or more selected reactive feedstock gases into the first and second vacuum chamber means.

7. Apparatus for depositing a superconducting thin film of metal oxide ceramic materials onto a surface of a wide area planar substrate, the apparatus comprising:

vacuum chamber means;

means for positioning a wide area planar substrate within said vacuum chamber means;

a planar magnetron positioned within said vacuum chamber means, the planar magnetron having a normal axis that is substantially coincident with a normal axis of the planar substrate, having a planar extraction grid positioned parallel to the planar substrate, having a planar anode of diameter positioned parallel to the planar substrate, having a planar cathode positioned parallel to the substrate, and having a planar magnetic field means positioned parallel to the planar substrate for providing a magnetic field focused on a surface of the planar substrate to be coated;

line-shaped cold cathode means for providing a beam of electrons impinging on the surface of the planar substrate to be coated to create a uniform strip heat zone on said surface;

power supply means for applying selected operating voltages to the planar cathode, planar anode, planar magnetic field means, and line-shaped cold cathode means;

vacuum control means coupled to the vacuum chamber means for establishing and maintaining a desired vacuum within the vacuum chamber means; and gas port means coupled to the vacuum control means and vacuum chamber means for admitting and controlling the flow of one or more selected reactive feedstock gases into the vacuum chamber means.

* * * * *